United States Patent
Um

(10) Patent No.: US 7,863,711 B2
(45) Date of Patent: Jan. 4, 2011

(54) SEMICONDUCTOR WAFER AND METHOD FOR CUTTING THE SAME

(75) Inventor: Ki Young Um, Yongin-si (KR)

(73) Assignee: LG Electronics Inc., Seoul (KR)

( * ) Notice: Subject to any disclaimer, the term of this patent is extended or adjusted under 35 U.S.C. 154(b) by 44 days.

(21) Appl. No.: 12/058,543

(22) Filed: Mar. 28, 2008

(65) Prior Publication Data

US 2008/0258269 A1 Oct. 23, 2008

(30) Foreign Application Priority Data

Apr. 9, 2007 (KR) .................. 10-2007-0034642

(51) Int. Cl.
*H01L 29/06* (2006.01)
(52) U.S. Cl. ................ 257/623; 257/462; 257/E29.005
(58) Field of Classification Search ................ 257/623, 257/E29.005; 438/462
See application file for complete search history.

(56) References Cited

U.S. PATENT DOCUMENTS

| 2003/0141508 A1* | 7/2003 | Okuyama et al. ............. 257/79 |
| 2005/0151145 A1* | 7/2005 | Lin et al. ....................... 257/98 |
| 2007/0091958 A1* | 4/2007 | Miyachi et al. ........ 372/50.121 |

* cited by examiner

*Primary Examiner*—Tan N Tran
(74) *Attorney, Agent, or Firm*—KED & Associates, LLP

(57) ABSTRACT

A semiconductor wafer and a method for cutting the same are provided, which enable separation of the semiconductor wafer by natural cleavage planes. The cutting method includes preparing a substrate including a semiconductor layer with at least one projection, formed on a predetermined area thereof; forming a post on an upper surface of the semiconductor layer at one or both sides of the projection to be placed on a cleaving line for cutting of the semiconductor layer; and cutting the substrate including the semiconductor layer along the cleaving line by performing a scribing process in a direction from the substrate and a breaking process in a direction from the semiconductor layer.

20 Claims, 5 Drawing Sheets

SEMICONDUCTOR WAFER AND METHOD FOR CUTTING THE SAME

This application claims the benefit of the Korean Patent Application No. 10-2007-0034642, filed on Apr. 9, 2007, which is hereby incorporated by reference as if fully set forth herein.

BACKGROUND OF THE INVENTION

1. Field of the Invention

The present invention relates to a semiconductor wafer and a method for cutting the same, and more particularly, to a semiconductor wafer and a method for cutting the same capable of separating the semiconductor wafer by natural cleavage planes.

2. Discussion of the Related Art

Generally, in dicing a semiconductor wafer into individual semiconductor chips, a dicing saw equipped with a diamond tip or a scriber have been used.

The dicing saw is a kind of cutting devices, which fully cuts the semiconductor wafer by rotating a disc-type blade equipped with a diamond tip or draws wide grooves corresponding to the width of the blade.

The scriber draws scribe lines having a fine width and a predetermined depth on a semiconductor wafer through a reciprocating motion of a leading end thereof equipped with a diamond tip.

When using the dicing saw, chipping or cracks are likely to occur at sectional surfaces and accuracy of the cutting is hardly guaranteed. Therefore, the scriber is more popularly used in the cutting process for fabricating the semiconductor chips.

However, even the scriber produces a quantity of pollutive materials during the cutting since it uses a mechanical driving system of the diamond tip. Moreover, the mechanical driving force may incur undesirable delamination of the semiconductor layer.

Such a problem occurs more seriously when cutting the semiconductor wafer for fabricating a blue light emitting diode (LED).

The semiconductor layer of the blue LED comprises gallium nitride (GaN)-based compounds including GaN, indium GaN (InGaN), and gallium aluminum nitride (GaAlN). Here, a sapphire substrate is generally used as a wafer for growth of a semiconductor crystal. However, since the sapphire substrate and the semiconductor layer containing the GaN-based compounds have different crystal properties from each other, delamination is apt to be generated.

In addition, the sapphire substrate and the semiconductor layer of the GaN-based compounds are very hard, having the Mohs hardness scale 9. Therefore, even with the diamond tip of the scriber, the cutting process takes a long time. More specifically, the cutting process occupies nearly 70% of the whole fabrication time.

Furthermore, in the sapphire substrate or the semiconductor layer of the GaN-based compounds, the semiconductor wafer may be cracked rather than being bent or separated along natural cleavage planes. Also, ridges of the semiconductor wafer may be damaged.

If the cracking or the damage of ridges occurs, the laser diode may not oscillate at all. Although the oscillation is performed, the laser property is greatly deteriorated.

SUMMARY OF THE INVENTION

Accordingly, the present invention is directed to a semiconductor wafer and a method for cutting the same that substantially obviate one or more problems due to limitations and disadvantages of the related art.

An object of the present invention is to provide a semiconductor wafer and a method for cutting the same, which are capable of preventing occurrence of cracking and damage of ridges during cutting of the semiconductor wafer, by forming a post on the semiconductor wafer.

Another object of the present invention is to provide a semiconductor wafer and a method for cutting the same, which are capable of remarkably reducing the cost incurred by the cutting process while improving the quality of product, by forming a post on the semiconductor wafer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor wafer comprises a substrate; a semiconductor layer formed on an upper surface of the substrate and having at least one projection; and a post formed on an upper surface of the semiconductor layer at one or both sides of the projection.

The post may have a greater height than the projection. The post may have a greater width than the projection.

The post may be formed on a cleaving line for cutting of the semiconductor layer.

The post may comprise a dielectric substance. The semiconductor layer may comprise a nitride-based compound semiconductor. The substrate may comprise any one of a sapphire substrate, a nitride-based compound semiconductor substrate, and a silicon carbide (SiC) substrate.

In another aspect of the present invention, a semiconductor wafer comprises a wafer; a semiconductor layer formed on an upper surface of the substrate and including at least one ridge; an electrode formed on an upper surface of the ridge; and a post formed on an upper surface of the semiconductor layer at one or both sides of the ridge to be placed on a cleaving line for cutting of the semiconductor layer.

In another aspect of the present invention, a method for cutting a semiconductor wafer, comprises preparing a substrate including a semiconductor layer with at least one projection, formed on a predetermined area thereof; forming a post on an upper surface of the semiconductor layer at one or both sides of the projection to be placed on a cleaving line for cutting of the semiconductor layer; and cutting the substrate including the semiconductor layer along the cleaving line by performing a scribing process in a direction from the substrate and a breaking process in a direction from the semiconductor layer.

The post forming step may comprise forming a dielectric layer on the whole upper surface of the semiconductor layer including the projection; forming a mask layer on an upper surface of the dielectric layer; patterning the mask layer so that a predetermined area of the dielectric layer is exposed; etching the exposed area of the dielectric layer with the patterned mask layer serving as a mask; and obtaining the post by removing the remaining mask layer, the post formed at one or both sides of the projection on the semiconductor layer and placed on the cleaving line for cutting of the semiconductor layer.

The post obtaining step may comprise forming a photosensitive dielectric layer on the whole upper surface of the semiconductor layer including the projection; and obtaining the post by exposing and developing a predetermined area of the photosensitive dielectric layer, the post formed at one or both sides of the projection on the semiconductor layer and placed on the cleaving line for cutting of the semiconductor layer.

The substrate cutting step may comprise performing the scribing process by forming a scribe line in the form of a groove having a predetermined depth on an upper surface of the substrate along the cleaving line; and performing the breaking process by placing a cutting blade on the post formed along the cleaving line and applying a force from an upper part of the post toward the scribe line formed on the upper surface of the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor wafer and a method for cutting the same according to the preferred embodiments of the present invention will be described with reference to the accompanying drawings.

Figure 1A:
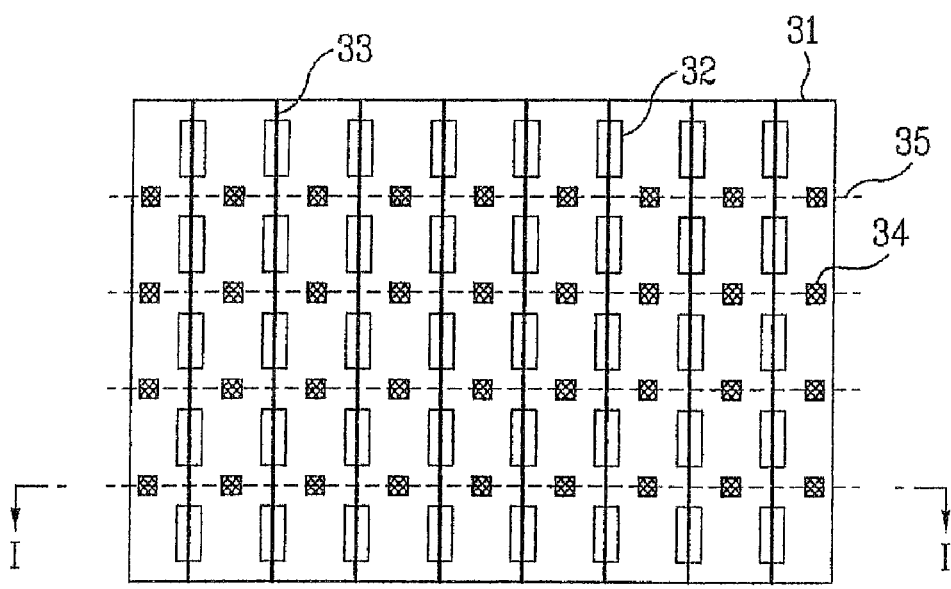
FIGS. 1A and 1B schematically show a semiconductor wafer according to an embodiment of the present invention.
Figure 1B:
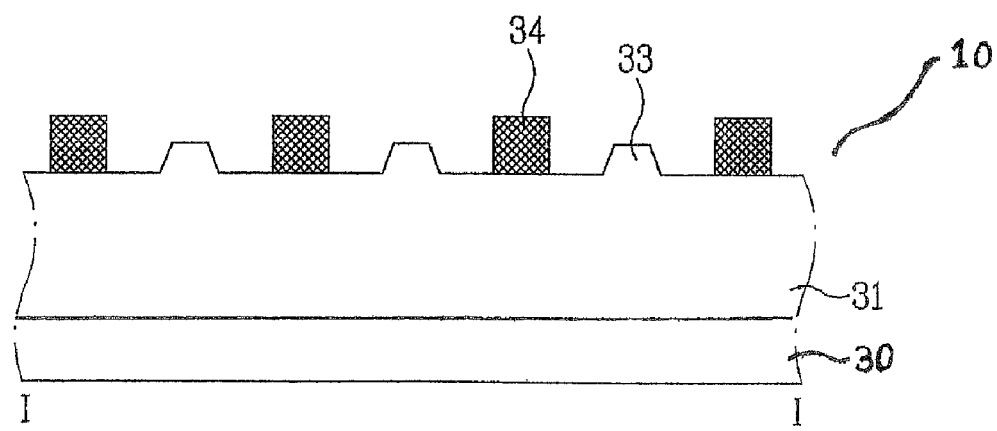

FIG. 1A and FIG. 1B are schematic views showing a semiconductor wafer 10 according to an embodiment of the present invention. More specifically, FIG. 1A is a plan view of the semiconductor wafer 10 and FIG. 1B is a cross-sectional view taken along a line I-I of FIG. 1A.

In FIG. 1A and FIG. 1B showing the semiconductor wafer 10 for fabricating a laser diode, the semiconductor wafer 10 comprises a substrate 30, a semiconductor layer 31 formed on an upper surface of the substrate 30 and including a ridge 33, an electrode 32 formed on an upper surface of the ridge 33, and posts 34 formed along cleaving lines 35 disposed on both sides of each ridge 33.

The substrate 30 includes hexagonal crystals such as sapphire, a nitride-based compound semiconductor, and silicon carbide (SiC). The semiconductor layer 31 is grown on the upper surface of the substrate 30 having the hexagonal crystals, being comprised of nitride-based compounds such as gallium nitride (GaN).

In case of the laser diode, for example, the ridge 33 is protruded on an upper surface of the semiconductor layer 31 where the laser oscillates. One or more ridges 33 in the form of a stripe are arranged perpendicularly to the cleaving lines 35.

The electrode 32 is formed on the upper surface of the ridge 33 in order to apply an electric current to the laser diode. The posts 34 are disposed on each cleaving line 35 for cutting of the semiconductor layer 31, and formed on the semiconductor layer 31 at both sides of the ridge 33. As necessary, the posts 34 may be formed at any one side of the ridge 33 on the semiconductor layer 31.

Here, it is preferred that each post 34 is formed to be higher and wider than the ridge 33. According to the embodiment of the present invention, the post 34 has the height and the width of approximately 4~160 μm. The reason for forming the post 34 by the above height and width is as follows.

If the height and the width of the post 34 each are greater than approximately 160 μm, the semiconductor layer 31 would not be easily cut due to its great size when performing a breaking process which cuts the semiconductor layer 31 along the cleaving line 35. Although the cutting can be performed, the sectional surfaces are apt to be damaged by an excessive cutting force.

If the height and the width of the post 34 each is less than approximately 4 μm, on the other hand, the post 34 cannot properly function during the breaking process since being too small. Accordingly, the ridge 33 may be damaged.

The height and width of the post 34 may be varied in accordance with the size of the ridge 33. For example, the ridge 33 has an approximately 3 μm size in a storage laser diode. However, in a high-output laser diode, the ridge 33 has a broad strip form of approximately 10~150 μm.

Additionally, the post 34 is a dielectric substance consisting of any one selected from $SiO_2$, SiNx, $TiO_2$ and so on. In some cases, a photosensitive dielectric substance may be used for the post 34.

The post 34 of the embodiment of the present invention functions as a spacer for protecting the ridge 33. Therefore, the post 34 preferably has a greater height and a greater width than the ridge 33.

Figure 2:
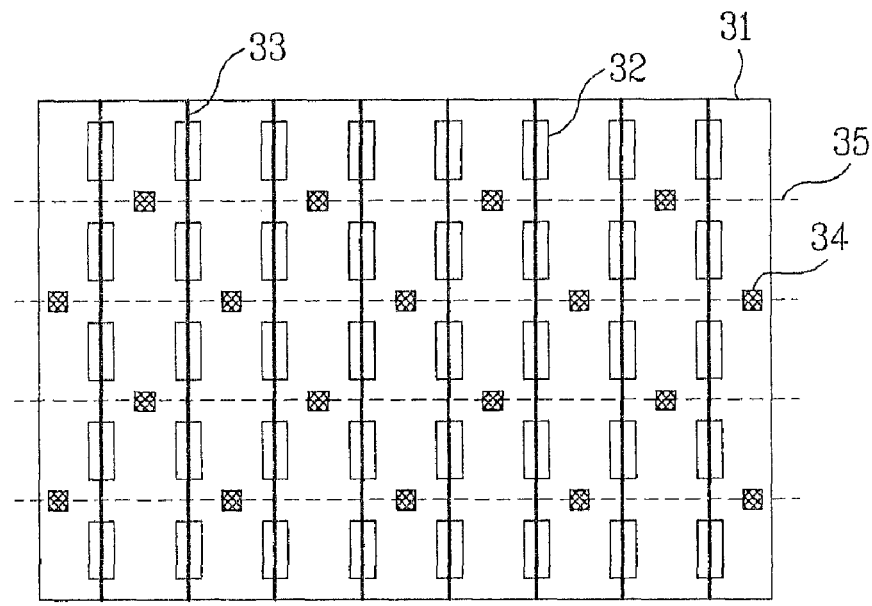
FIG. 2 schematically shows a semiconductor wafer according to another embodiment of the present invention.

According to circumstances, the post 34 may be arranged in such a manner that posts 34 formed on odd-numbered cleaving lines 35 and posts 34 formed on even-numbered cleaving lines 35 are not linearly corresponded to each other, as shown in FIG. 2.

According to circumstances, a protection layer may be further formed on the upper surface of the semiconductor layer 31. To be more specific, the protection layer may formed on the upper surface of the semiconductor layer 31, and the post 34 may be formed on an upper surface of the protection layer so that damage of the ridge 33 can be more effectively prevented during the breaking process.

The reason for forming the post as described above is as follows.

According to the embodiment of the present invention, a scribing process and the breaking process are performed to cut the substrate including the semiconductor layer.

In order to cut the substrate formed with the semiconductor layer, the scribing process is performed by forming a scribe line on the upper surface of the substrate along the cleaving line by a predetermined depth.

Next, the breaking process is performed by positioning a cutting blade on the post formed along the cleaving line and applying a force from an upper part of the post toward the scribe line formed on the substrate, thereby cutting the substrate formed with the semiconductor layer.

Figure 3:
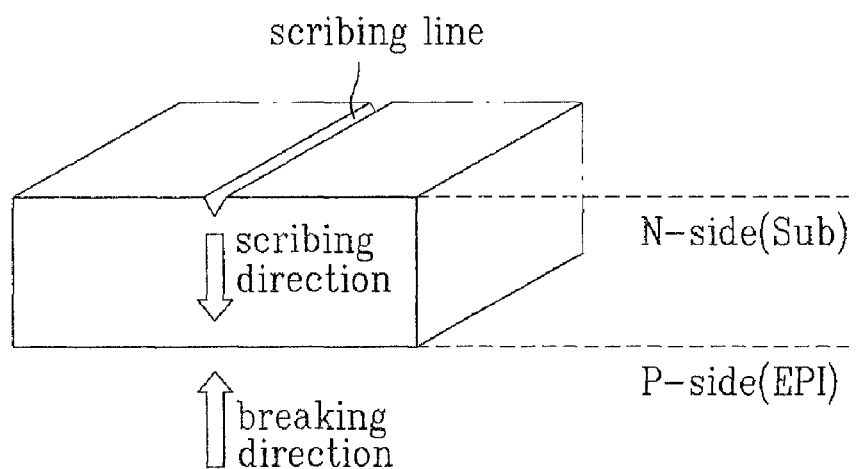
FIG. 3 illustrates a method for cutting the semiconductor wafer according to the embodiment of the present invention.

FIG. 3 is a drawing illustrating a method for cutting the semiconductor wafer according to the embodiment of the present invention.

More specifically, FIG. 3 shows a method for cutting a substrate including the semiconductor layer containing a compound such as GaN. As shown in FIG. 3, the scribing process that forms the scribe line on the substrate along the cleaving line is performed and then the breaking process is performed from the surface of the semiconductor layer to the scribe line of the substrate.

According to the embodiment of the present invention, edge scribing is performed on the substrate which is an N-side and the breaking is performed on an epitaxial (EPI) wafer which is a P-side, thereby cutting the semiconductor wafer.

Figure 4A:
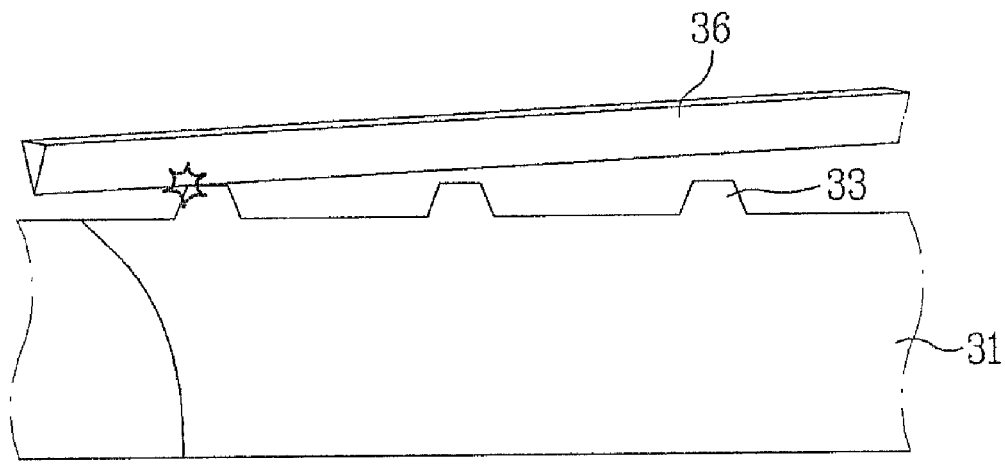
FIGS. 4A and 4B are views for explaining a breaking process according to the embodiment of the present invention.
Figure 4B:
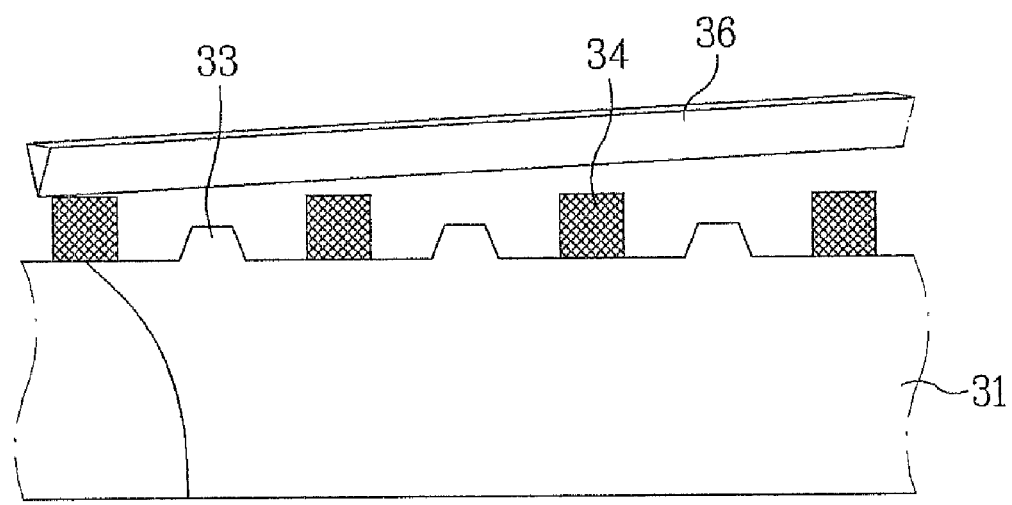

FIG. 4A and FIG. 4B are drawings illustrating the breaking process. In FIG. 4A, the breaking process of the semiconductor wafer is performed without the post. In FIG. 4B, the breaking process is performed with the post provided.

As shown in FIG. 4A, when the post is not provided, a cutting blade 36 is positioned directly on the upper part of the semiconductor layer 31 including the ridge 33 thereon and a force is applied to the cutting blade 36. As a cleaving plane is cut along the scribe line formed on the substrate, the substrate having the semiconductor layer 31 is cut.

However, due to the direct contact between the cutting blade 36 and the ridge 33, the ridge 33 is mechanically damaged. As a consequence, oscillation of the laser may not be performed or the optical property of the laser diode may be greatly deteriorated.

On the other hand, when the post 34 is provided as shown in FIG. 4B, since the cutting blade 36 first contacts the post 34 formed along the cleaving line prior to the ridge 33, damage of the ridge 33 can be highly reduced.

In other words, the post 34 functions as a spacer and thereby effectively relieves a mechanical shock transmitted to the ridge 33.

According to circumstances, the protection layer may be further formed on the upper surface of the semiconductor layer 31. If the protection layer is formed on the semiconductor layer 31, and the post 34 is formed on the protection layer, the ridge 33 can be protected from damage during the breaking process. Furthermore, since natural cleavage planes can be obtained, the optical property of the laser diode will be greatly improved.

Besides the cutting method for the semiconductor wafer illustrated by FIG. 3, another method may be applied to cut the semiconductor wafer.

For example, after the scribing process is performed by forming the scribe line on the semiconductor layer along the cleaving line, the breaking process can be performed from the surface of the substrate toward the scribe line.

More specifically, after the edge scribing is performed on the EPI wafer which is the P-side, the breaking may be performed on the substrate which is the N-side, thereby cutting the semiconductor wafer.

The cutting method according to the embodiment of the present invention can be applied in fabricating various elements other than the laser diode. That is, the cutting method according to the embodiment of the present invention can widely be used in cutting a semiconductor wafer having a projection such as the ridge. For example, after forming a semiconductor layer having at least one projection, on the upper surface of the substrate, the post may be formed at one or both sides of the projection on the semiconductor layer.

As necessary, the semiconductor layer may further include the protection layer formed thereon while the post is formed on the protection layer.

In this case as well, it is preferred that height and width of the post are greater than height and width of the projection. Here, the height and the width of the post can be in a range of approximately 1~200 μm, but preferably being in a range of approximately 4~160 μm.

The post is formed on the cleaving line formed for cutting the semiconductor layer, and may comprise a dielectric substance including $SiO_2$, SiNx, $TiO_2$ and so on.

Figure 5A:
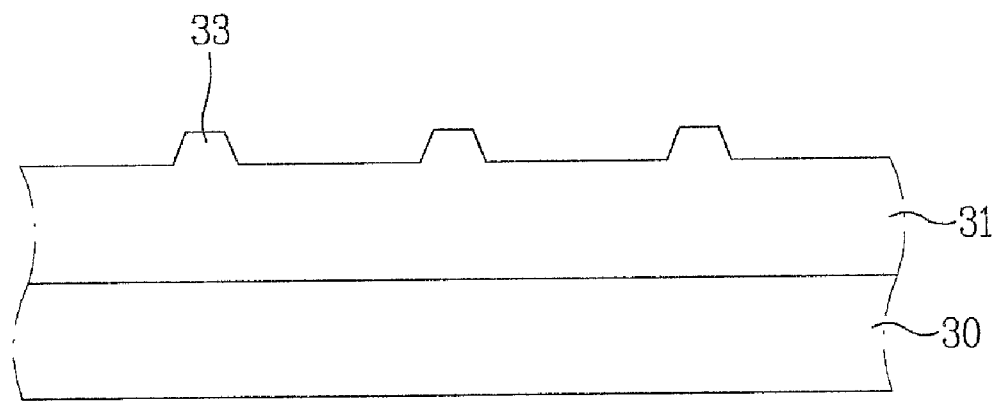
FIGS. 5A through 5D illustrate processes of the method for cutting the semiconductor wafer according to the embodiment of the present invention.

FIG. 5A through FIG. 5D illustrate the processes of the method for cutting the semiconductor wafer 10 according to the embodiment of the present invention. First, a substrate 30 formed with the semiconductor layer 31 having at least one ridge 33 disposed at a predetermined area is provided as shown in FIG. 5A. Here, the protection layer may be further formed on the upper surface of the semiconductor layer 31 as necessary.

Figure 5B:
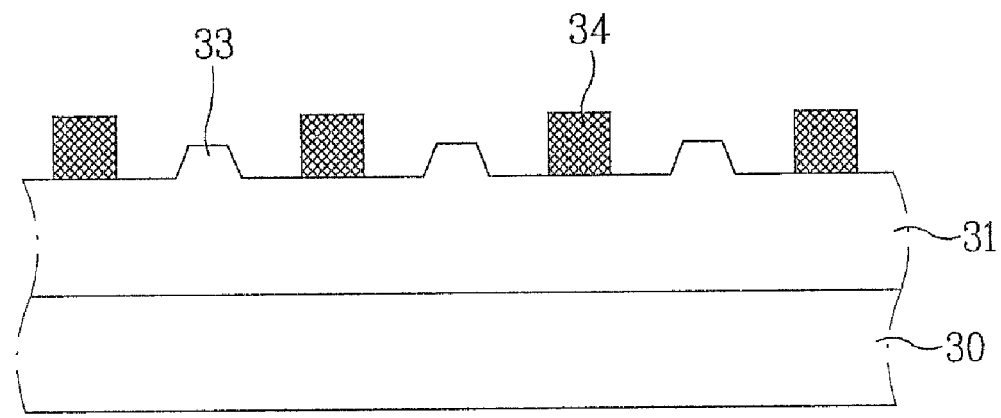

Next, the post 34 is formed on the semiconductor layer 31 at one or both sides of the ridge 33 to be positioned on the cleaving line for cutting of the semiconductor layer 31, as shown in FIG. 5B.

Here, two methods can be applied in fabricating the post 34. A first method uses a non-photosensitive dielectric substance while a second method uses a photosensitive dielectric substance.

In accordance with the first method, a dielectric layer is formed on the whole surface of the semiconductor layer which includes the ridge. Here, the dielectric layer may be any one selected from $SiO_2$, SiNx, and $TiO_2$.

Next, a mask layer is formed on the dielectric layer and the mask layer is patterned, thereby exposing the dielectric layer by a predetermined area. Here, the mask layer may comprise photoresist.

Next, etching is performed with respect to the exposed area of the dielectric layer, with the patterned mask layer serving as a mask. Then, by removing the remaining mask layer, the post is formed on the semiconductor layer at one or both sides of the ridge, as being positioned on the cleaving line for cutting the semiconductor layer.

In accordance with the second method, the photosensitive dielectric layer is applied on the whole upper surface of the semiconductor layer which includes the ridge. Here, the dielectric layer may be any one selected from $SiO_2$, SiNx, and $TiO_2$ containing photosensitive organic materials.

A predetermined area of the photosensitive dielectric layer is exposed and developed, thereby obtaining the post formed on the semiconductor layer at one or both sides of the ridge to be placed on the cleaving line for cutting the semiconductor layer.

Figure 5C:
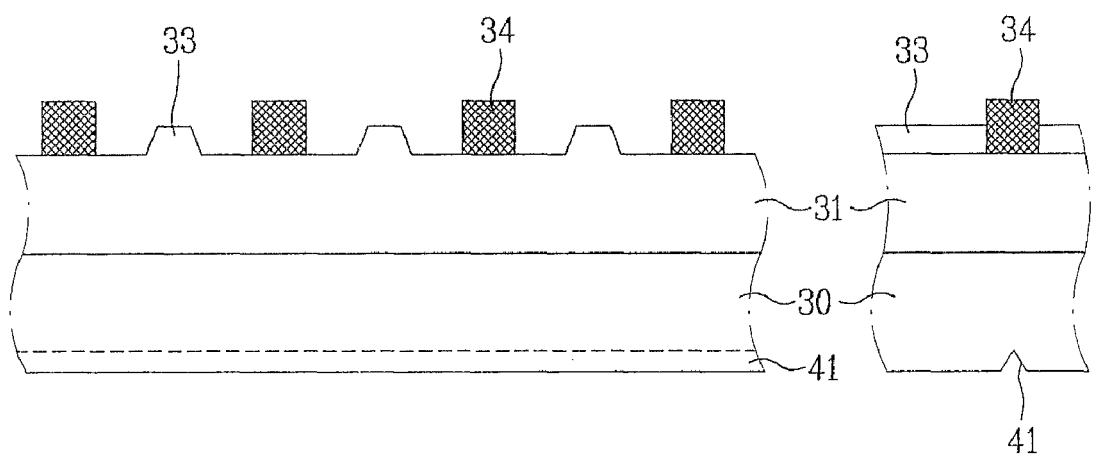
Figure 5D:
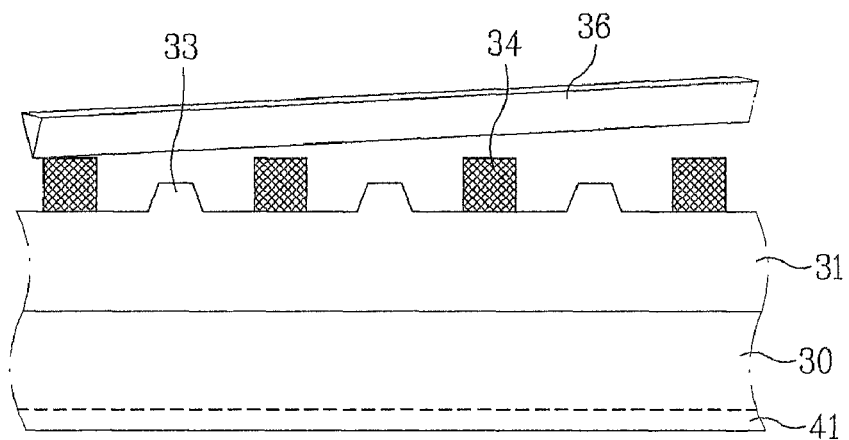

After thus forming the post, the scribing process is performed with the substrate 30 in such a manner that a scribe line 41 having a predetermined depth is formed on the surface of the substrate 30 corresponding to the cleaving line, as shown in FIG. 5C.

Next, the breaking process is performed in a direction from the semiconductor layer 31. More particularly, the cutting blade 36 is positioned on the posts 34 formed along the cleaving line and in this state, a force is applied from the upper part of the post 34 toward the scribe line 41 formed on the substrate 30, thereby cutting the substrate 30 having the semiconductor layer 31 thereon.

As can be appreciated from the above description, a semiconductor wafer and a method for cutting the same according to the embodiment of the present invention are capable of obtaining natural cleavage planes by cutting the semiconductor wafer without causing cracking or damage of ridges, and also improving the optical property of a laser diode while economizing in the fabrication cost. Accordingly, the present invention is applicable to fabrication of various elements including a laser diode, an LED and a semiconductor device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor wafer, comprising:
a substrate;
a semiconductor layer formed on an upper surface of the substrate, the semiconductor layer having at least one projection and an electrode; and
at least one post formed on an upper surface of the semiconductor layer, wherein the at least one projection and the electrode overlap each other, the at least one post is spaced apart from the electrode, and the at least one post and the electrode are alternately formed.

2. The semiconductor wafer according to claim 1, wherein a height of the at least one post is greater than a height of the at least one projection.

3. The semiconductor wafer according to claim 1, wherein a width of the at least one post is greater than a width of the at least one projection.

4. The semiconductor wafer according to claim 1, wherein a height and a width of the at least one post are within a range of approximately 4-160 μm.

5. The semiconductor wafer according to claim 1, wherein the at least one projection is arranged in a first direction, wherein at least one cleaving line for cutting the semiconductor layer is arranged in a second direction that is perpendicular to the first direction, and wherein the at least one post is formed on the at least one cleaving line.

6. The semiconductor wafer according to claim 5, wherein the at least one projection comprises a plurality of projections, the at least one cleaving line comprises a plurality of cleaving lines, and the at least one post comprises a plurality of posts.

7. The semiconductor wafer according to claim 6, wherein posts are formed at each side of each projection.

8. The semiconductor wafer according to claim 1, wherein the at least one post comprises a dielectric substance.

9. The semiconductor wafer according to claim 1, wherein the at least one post comprises at least one of $SiO_2$, $SiN_x$, or $TiO_2$.

10. The semiconductor wafer according to claim 1, wherein the semiconductor layer comprises a nitride-based compound semiconductor.

11. The semiconductor wafer according to claim 1, wherein the substrate comprises one of a sapphire substrate, a nitride-based compound semiconductor substrate, or a silicon carbide (SiC) substrate.

12. The semiconductor wafer according to claim 1, wherein the at least one electrode is formed on an upper surface of the at least one projection.

13. A semiconductor wafer, comprising:
a substrate;
a semiconductor layer formed on an upper surface of the substrate, the semiconductor layer including at least one ridge;
at least one electrode overlapping the at least one ridge; and
at least one post formed on an upper surface of the semiconductor layer, and the at least one post is provided on at least one cleaving line for cutting the semiconductor layer,
wherein the at least one post is spaced apart from the at least one electrode, and the at least one post and the at least one electrode are alternately formed.

14. The semiconductor wafer according to claim 13, wherein the at least one ridge is formed perpendicular to the cleaving line.

15. The semiconductor wafer according to claim 13, wherein a height and a width of the at least one post is greater than a height and a width of the at least one ridge.

16. The semiconductor wafer according to claim 13, wherein a height and a width of the at least one post are within a range of approximately 4-160 μm.

17. The semiconductor wafer according to claim 13, wherein the at least one electrode is formed on an upper surface of the at least one ridge.

18. The semiconductor wafer according to claim 13, wherein the at least one ridge is arranged in a first direction, wherein at least one cleaving line for cutting the semiconductor layer is arranged in a second direction that is perpendicular to the first direction, and wherein the at least one post is formed on the at least one cleaving line.

19. The semiconductor wafer according to claim 18, wherein the at least one ridge comprises a plurality of ridges, the at least one cleaving line comprises a plurality of cleaving lines, and the at least one post comprises a plurality of posts.

20. The semiconductor wafer according to claim 19, wherein posts are formed at each side of each ridge.

* * * * *